United States Patent
Kano

(10) Patent No.: US 6,664,561 B2
(45) Date of Patent: Dec. 16, 2003

(54) LIGHT-RECEIVING DEVICE WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 0 days.

(21) Appl. No.: 09/915,384

(22) Filed: Jul. 27, 2001

(65) Prior Publication Data

US 2001/0042861 A1 Nov. 22, 2001

Related U.S. Application Data

(62) Division of application No. 09/300,389, filed on Apr. 27, 1999.

(30) Foreign Application Priority Data

Apr. 28, 1998 (JP) ............................................. 10-134335

(51) Int. Cl.[7] .................... H01L 29/868; H01L 31/0352
(52) U.S. Cl. ........................... 257/21; 257/17; 257/184; 257/461
(58) Field of Search ................................. 257/9, 12–15, 257/17–24, 79, 94, 96, 97, 183, 184, 186, 187, 192, 199–201, 431, 438, 461, 613–616

(56) References Cited

U.S. PATENT DOCUMENTS

| | | | |
|---|---|---|---|
| 5,091,756 A | * | 2/1992 | Iga et al. ........................ 357/4 |
| 5,311,009 A | * | 5/1994 | Capasso et al. .............. 250/214 |
| 5,324,959 A | | 6/1994 | Nakamura et al. |
| 5,471,068 A | | 11/1995 | Tsuji et al. |
| 5,737,350 A | | 4/1998 | Motoda et al. |
| 6,175,123 B1 | | 1/2001 | Kano |
| 6,188,082 B1 | | 2/2001 | Kano |
| 6,188,083 B1 | | 2/2001 | Kano |
| 6,294,795 B1 | | 9/2001 | Kano |

FOREIGN PATENT DOCUMENTS

| | | | |
|---|---|---|---|
| EP | 0 497 279 | 8/1992 | |
| EP | 0 702 439 | 3/1996 | |
| JP | 1-181578 | * 7/1989 | .................. 257/17 |
| JP | 5-190902 | * 7/1993 | ........... H01L/33/00 |
| WO | WO 90/05996 | 5/1990 | |

OTHER PUBLICATIONS

Yu et al., "Largely enhanced bound–to–miniband absorption in an InGaAs multiple quantum well with short–period superlattice InAlAs/InGaAs barrier," Appl. Phys. Lett. 59 (21), Nov. 18, 1991 pp. 2712–2714.*

U.S. patent application Ser. No. 09/245,299, filed Feb. 5, 1999, allowed.

(List continued on next page.)

Primary Examiner—B. William Baumeister
(74) Attorney, Agent, or Firm—Oblon, Spivak, McClelland, Maier & Neustadt, P.C.

(57) ABSTRACT

A light-receiving device of a pin junction structure, constituted by a quantum-wave interference layers $Q_1$ to $Q_4$ with plural periods of a pair of a first layer W and a second layer B and carrier accumulation layers $C_1$ to $C_3$. The second layer B has wider band gap than the first layer W. Each thicknesses of the first layer W and the second layer B is determined by multiplying by an odd number one fourth of wavelength of quantum-wave of carriers in each of the first layer W and the second layer B existing at the level near the lowest energy level of the second layer B. A $\delta$ layer, for sharply varying energy band, is formed at an every interface between the first layer W and the second layer B and has a thickness substantially thinner than the first layer W and the second layer B. As a result, when electrons are excited in the carrier accumulation layers $C_1$ to $C_3$, electrons are propagated through the quantum-wave interference layer from the n-layer to the p-layer as a wave, and electric current flows rapidly.

23 Claims, 10 Drawing Sheets

OTHER PUBLICATIONS

U.S. patent application Ser. No. 09/296,743, filed Apr. 23, 1999, pending.
U.S. patent application Ser. No. 09/320,510, filed May 26, 1999, pending.
U.S. patent application Ser. No. 09/421,221, filed Oct. 20, 1999, pending.
U.S. patent application Ser. No. 09/422,078, filed Oct. 21, 1999, pending.
U.S. patent application Ser. No. 09/425,737, filed Oct. 22, 1999, allowed.
U.S. patent application Ser. No. 09/425,735, filed Oct. 22, 1999, pending.
U.S. patent application Ser. No. 09/425,685, filed Oct. 22, 1999, pending.
U.S. patent application Ser. No. 09/461,331, filed Dec. 15, 1999, pending.
U.S. patent application Ser. No. 09/461,756, filed Dec. 16, 1999, pending.
U.S. patent application Ser. No. 09/636,081, filed Aug. 11, 2000, pending.
U.S. patent application Ser. No. 09/645,931, filed Aug. 25, 2000, pending.
U.S. patent application Ser. No. 09/648,367, filed Aug. 25, 2000, pending.
U.S. patent application Ser. No. 09/645,932, filed Aug. 25, 2000, pending.
U.S. patent application Ser. No. 09/669,855, filed Sep. 27, 2000, pending.
U.S. patent application Ser. No. 09/688,201, filed Oct. 16, 2000, pending.
U.S. patent application Ser. No. 09/695,312, Oct. 25, 2000, pending.
U.S. patent application Ser. No. 09/915,384, filed Jul. 27, 2001, pending.
Takeshi Takagi, et al., Japanese Journal of Applied Physics, Part 1, vol. 31, No. 2A, pp. 197–200, "Electron Wave Reflection by Multiquantum Barrier", Feb. 1992.
S.T. Yen, et al., Applied Physic Letters, vol. 64, No. 9, pp. 1108–1110, "Enhancement of Electron–Wave Reflection by Superlattices With Multiple Stacks of Multiquantum Barriers", Feb. 28, 1994.
Larry S. Yu, et al., Applied Physic Letters, vol. 59, No. 21, pp. 2712–2714, "Largely Enhanced Bound–to–Miniband Absorption in an InGaAs Multiple Quantum Well With Short–Period Superlattice InAlAs/InGaAs Barrier", Nov. 18, 1991.
T. Takagi, et al., Japanese Journal of Applied Physics, vol. 29, No. 11, pp. L 1977–L 1980, Potential Barrier Height Analysis of AlGaInP Multi–Quantum Barrier (MQB), Nov., 1990.
A. Kikuchi, et al., research materials of The Institute of Electronics, Information and Communication Engineers, Electronic Device, pp. 15–21, "Design of AlGaInP Multi–Quantum–Barrier", 1991–3, (With English Abstract).
T. Takagi, et al., research materials of The Institute of Electronics, Information and Communication Engineers, Optical Quantum Electronics, pp. 73–78, "Design of Multi–Quantum Barrier (MQB) and Experimental Verification of MQB Effect", 1991–3, (With Partial English Translation).

* cited by examiner

F I G. 5A
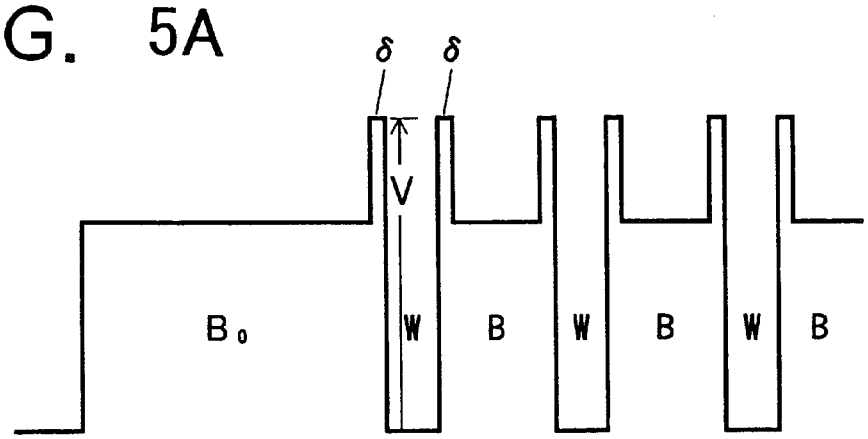
F I G. 5B
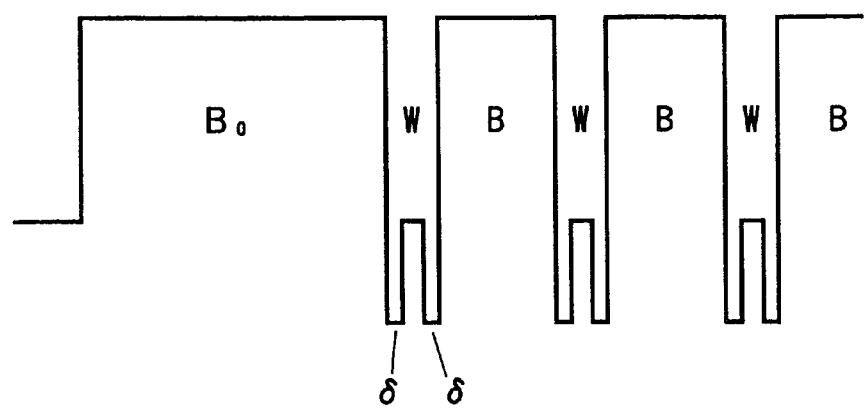
F I G. 5C
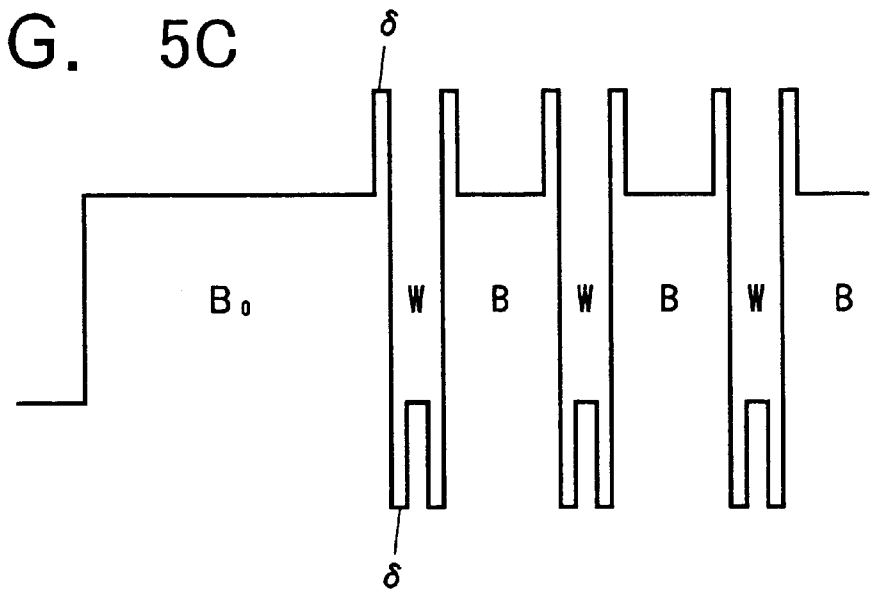

LIGHT-RECEIVING DEVICE WITH QUANTUM-WAVE INTERFERENCE LAYERS

CROSS-REFERENCE TO RELATED APPLICATIONS

The present application is a divisional application of Ser. No. 09/300,389 ("the parent application") filed Apr. 27, 1999 (now allowed) and claims priority to Japanese Application No. JP 10-134335 filed Apr. 28, 1998.

BACKGROUND OF THE INVENTION

1. Field of the Invention

The present invention relates to an opto-electric conversion device with a new structure, or a light-receiving device.

2. Description of the Related Art

A light-receiving device has been known to have a pin junction structure. A backward voltage is applied to the pin layers of the device, and electron-hole pairs are generated by that light incident from the side of a p-layer is absorbed in an i-layer. The electron-hole pairs excited in the i-layer are accelerated by a backward voltage in the i-layer, and electrons and holes are flowing into an n-layer and a p-layer, respectively. Thus a photocurrent whose intensity varies according to an intensity of the incident light is outputted.

To improve an opto-electric conversion effectivity, the i-layer which absorbs light is formed to have a comparatively larger thickness. But when the thickness of the i-layer becomes thicker, more times are needed to draw carriers to the n-layer and the p-layer. As a result, the response velocity of the opto-electric conversion is lowered. To improve the velocity, an electric field in the i-layer is increased by increasing a backward voltage. But when the backward voltage is enlarged, element separation becomes difficult and a leakage current occurs. As a result, a photocurrent which flows when light is not incident on the device, or a dark current, is increased.

Thus conventional light-receiving devices had an interrelation among a light-receiving sensitivity, a detecting velocity, and a noise current, which restricts their performances.

SUMMARY OF THE INVENTION

It is, therefore, an object of the present invention to improve the light-receiving sensitivity and the response velocity Of the opto-electric conversion by providing a light-receiving device having a pin junction of a completely new structure.

In light of these objects a first aspect of the present invention is a light-receiving device, which converts incident light into electric current, constituted by quantum-wave interference layer units having plural periods of a pair of a first layer and a second layer, the second layer having a wider band gap than the first layer, and a carrier accumulation layer disposed between adjacent two of the quantum-wave interference layer units. Each thickness of the first and the second layers is determined by multiplying by an odd number one fourth of a quantum-wave wavelength of carriers in each of the first and the second layers, and the carrier accumulation layer has a band gap narrower than that of said second layer. Plural units of the quantum-wave interference layers are formed with a carrier accumulation layer, which has a band gap narrower than that of the second layer, lying between each of the quantum-wave interference units.

The second aspect of the present invention is to set a kinetic energy of the carriers, which determines the quantum-wave wavelength, at the level near the bottom of a conduction band when the carriers are electrons or at the level near the bottom of a valence band in the second layer when the carriers are holes.

The fourth aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent Plank's constant, the effective mass of carrier conducting in the first layer, the effective mass of carriers in the second layer, the kinetic energy of the carriers at the level near the lowest energy level of the second layer, the potential energy of the second layer relative to the first layer, and odd numbers, respectively.

The fourth aspect of the present invention is a quantum-wave interference layer having partial quantum-wave interference layers $I_k$ with arbitrary periods $T_k$ including a first layer having a thickness of $n_{Wk}\lambda_{Wk}/4$ and a second layer having a thickness of $n_{Bk}\lambda_{Bk}/4$ for each of a plural different values $E_k$, $E_k+V$. $E_k$, $E_k+V$, $\lambda_{Bk}$, $\lambda_{Wk}$, and $n_{Bk}$, $n_{Wk}$ represents a kinetic energy of carriers conducted in the second layer, a kinetic energy of carriers conducted in the first layer, a quantum-wave wavelength corresponding energies of the second layer and the first layer, and odd numbers, respectively.

The fifth aspect of the present invention is to form a carrier accumulation layer having the same bandwidth as that of the first layer.

The sixth aspect of the present invention is to form a carrier accumulation layer having a same thickness as its quantum-wave wavelength $\lambda_W$.

The seventh aspect of the present invention is to form a δ layer between the first layer and the second layer, which sharply varies band gap energy at the boundary between the first and second layers and is substantially thinner than that of the first and the second layers.

The eighth aspect of the present invention is a light-receiving device having a pin junction structure, and the quantum-wave interference layer and the carrier accumulation layer are formed in the i-layer.

The ninth aspect of the present invention is to form the quantum-wave interference layer and the carrier accumulation layer in the n-layer or the p-layer.

The tenth aspect of the present invention is a light-receiving device having a pin junction structure.

First to Third, and Eighth to Tenth Aspects of the Invention

The principle of the light-receiving device of the present invention is explained hereinafter. FIG. 1 shows an energy diagram of a conduction band and a valence band when an external voltage is applied to the interval between the p-layer and the n-layer in a forward direction. As shown in FIG. 1, the conduction band of the i-layer becomes plane by applying the external voltage. Four quantum-wave interference layer units $Q_1$ to $Q_4$ are formed in the i-layer, and carrier accumulation layers $C_1$ to $C_3$ are formed at each interval of the quantum-wave interference layer units. FIG. 2 shows a conduction band of a quantum-wave interference layer unit $Q_1$ having a multi-layer structure with plural periods of a first layer W and a second layer B as a unit. A band gap of the second layer B is wider than that of the first layer W.

Electrons conduct from left to right as shown by an arrow in FIG. 2. Among the electrons, those that exist at the level near the lowest energy level of a conduction band in the second layer B are most likely to contribute to conduction. The electrons near the bottom of the conduction band of the second layer B have a kinetic energy E.

Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, the kinetic energy of electrons in the conduction band is modulated by potential energy due to the multi-layer structure.

When thicknesses of the first layer W and the second layer B are equal to an order of the quantum-wave wavelength, electrons tend to have characteristics of a wave. The wave length of the electron quantum-wave is calculated by Eqs. 1 and 2 using kinetic energy of the electron. Further, defining the respective wave number vector of first layer W and second layer B as $K_W$ and $K_B$, reflectivity R of the wave is calculated by:

$$R=(|K_W|-|K_B|)/(|K_W|+|K_B|)=([m_W$$
$$(E+V)]^{1/2}-[m_B E]^{1/2})/([m_W(E+V)]^{1/2}+[m_B E]^{1/2})=$$
$$[1-(m_B E/m_W(E+V))^{1/2}]/[1+(m_B E/m_W(E+V))^{1/2}] \quad (3).$$

Further, when $m_B=m_W$, the reflectivity R is calculated by:

$$R=[1-(E/(E+V))^{1/2}]/[1+(E/(E+V))^{1/2}] \quad (4).$$

When $E/(E+V)=x$, Eq. 6 is transformed into:

$$R=(1-x^{1/2})/(1+x) \quad (5).$$

The characteristic of the reflectivity R with respect to the energy ratio x obtained by Eq. 5 is shown in FIG. 3.

And when the second layer B and the first layer W have an s-layers structure, the reflectivity $R_S$ of an incident plane of the quantum-wave is calculated by:

$$R_S=[(1-x^s)/(1+x^s)]^2 \quad (6).$$

When the condition $x \leq 1/10$ is satisfied, $R \geq 0.52$. Accordingly, the relation between E and V is satisfied with:

$$E \leq V/9 \quad (7).$$

Since the kinetic energy E of the conducting electrons in the second layer B exists near the bottom of the conduction band, the relation of Eq. 7 is satisfied and the reflectivity R at the interface between the second layer B and the first layer W becomes 52% or more. Consequently, the multi-layer structure having two kinds of layers with band gaps different from each other enables reflection of quantum-wave of electrons, which conduct in an i-layer, between the first and second layers.

Further, utilizing the energy ratio x enables the thickness ratio $D_B/D_W$ of the second layer B to the first layer W to be obtained by:

$$D_B/D_W=[m_W/(m_B x)]^{1/2} \quad (8).$$

When light is incident to the i-layer, electrons excited in conduction bands of the carrier accumulation layers $C_1$, $C_2$ and $C_3$ are accumulated therein. The excited electrons tend to flow to the p-layer by applying the forward voltage, but the electrons do not flow because a reflection condition is satisfied for electrons in the quantum-wave interference layer unit which exists at the side toward the p-layer.

But when the electrons existing in the carrier accumulation layers $C_1$, $C_2$ and $C_3$ are increased, electrons tend to exist in higher level. Then a kinetic energy of the electrons existing in higher level increases, and the electrons are not reflected by the quantum-wave interference layer units because of unsatisfaction of the reflection condition. As a result, the electrons pass the quantum-wave interference layer units $Q_2$, $Q_3$, and $Q_4$ and flow toward the p-layer, and thereby a photocurrent results.

Because a forward voltage is applied to the light-receiving device, driving at a low voltage becomes possible and an element separation become easier. When light is not incident, electrons are reflected in the quantum-wave interference layer units effectively. As a result, an electric current does not occur and a dark current can be substantially lowered. The present inventor thinks that electrons are conducted in the quantum-wave interference layer units as a wave. Accordingly, a response velocity is considered to become larger.

The thicknesses of the first layer W and the second layer B are determined for selectively reflecting the holes or the electrons, because of the difference in potential energy between the valence and the conduction bands, and the difference in effective mass of holes and electrons in the first layer W and the second layer B. In other words, the optimum thickness for reflecting electrons is not the optimum thickness for reflecting holes. Eqs. 3–8 refer to a structure of the quantum-wave interference layer for selectively reflecting electrons. The thickness for selectively reflecting electrons is designed based on the difference in the potential energy of the conduction band and on the effective mass of electrons. Further, the thickness for selectively reflecting holes is designed based on the difference in the potential energy of the valence band and on the effective mass of holes, forming another type of quantum-wave interference layer in an i-layer for reflecting only holes and allowing electrons to pass through.

Accordingly, a quantum-wave interference layer unit which reflects holes and functions as a reflective layer to holes can be formed to connect in series to each quantum-wave interference layer units described above, which reflects only electrons.

The light-receiving device described above having a quantum-wave interference layer unit can have a state not to generate an electric current by reflecting carriers selectively in a range of 0 V to a certain value of a bias voltage. Accordingly, the light-receiving device can be formed by only one of the n-layer and the p-layer in which the quantum-wave interference layer units and the carrier accumulation layer are formed. Alternatively, the light-receiving device can be formed by a pn junction structure, in which the quantum-wave interference layer units and the carrier accumulation layer are formed.

Fourth Aspect of the Present Invention

FIG. 4 shows a plurality quantum-wave interference units $I_k$ with arbitrary periods $T_k$ including a first layer having a thickness of $D_{Wk}$ and a second layer having a thickness of $D_{Bk}$ and arranged in series.

Each thickness of the first and the second layers satisfies the formulas:

$$D_{Wk}=n_{Wk}\lambda_{Wk}/4=n_{Wk}h/4[2m_{Wk}(E_k+V)]^{1/2} \quad (9)$$

and $$D_{Bk}=n_{Bk}\lambda_{Bk}/4=n_{Bk}h/4(2m_{Bk}E_k)^{1/2} \qquad (10)$$

In Eqs. 9 and 10, $E_k$, $m_{Wk}$, $m_{Bk}$, and $n_{Wk}$ and $n_{Bk}$ represent plural kinetic energy levels of carriers conducted into the second layer, effective mass of carriers with kinetic energy $E_k+V$ in the first layer, effective mass of carriers with kinetic energy $E_k$ in the second layer, and arbitrary odd numbers, respectively.

The plurality of the partial quantum-wave interference layers $I_k$ are arranged in series from $I_l$ to $I_j$, where j is a maximum number of k required to form a quantum-wave interference layer as a whole. The carriers existing in a certain consecutive energy range can be reflected by narrowing discrete intervals.

Fifth and Sixth Aspects of the Present Invention

The fifth aspect of the present invention is to form the bandwidth of the carrier accumulation layer to have the same bandwidth as that of the first layer. And the sixth aspect of the present invention is to form the carrier accumulation layer to have a same thickness as its quantum wave wavelength $\lambda_W$. As a result, the carriers excited in the i-layer can be confined effectively.

Seventh Aspect of the Present Invention

The seventh aspect of the present invention is to form a δ layer at the interface between the first layer W and the second layer B. The δ layer has a thickness substantially thinner than both of the first layer W and the second layer B and sharply varies the energy band profile of the device. The reflectivity R of the interface is determined by Eq. 5. By forming the δ layer, the potential energy V of an energy band becomes larger and the value x of Eq. 5 becomes smaller. Accordingly, the reflectivity R becomes larger.

Variations are shown in FIGS. 5A to 5C. The δ layer may be formed on both ends of every first layer W as shown in FIGS. 5A to 5C. In FIG. 5A, the δ layers are formed so that an energy level higher than that of the second layer B may be formed. In FIG. 5B, the δ layers are formed so that an energy level lower than that of the first layer W may be formed. In FIG. 5C, the δ layers are formed so that a band bottom higher than that of the second layer B and a band bottom lower than that of the first layer W may be formed. As an alternative to each of the variations shown in FIGS. 5A to 5C, the δ layer can be formed on one end of every first layer W.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIGS. 5A to 5C are explanatory views of δ layers according to the present invention;

DETAILED DESCRIPTION OF THE PREFERRED EMBODIMENTS

The invention will be more fully understood by reference to the following examples.

Figure 6:
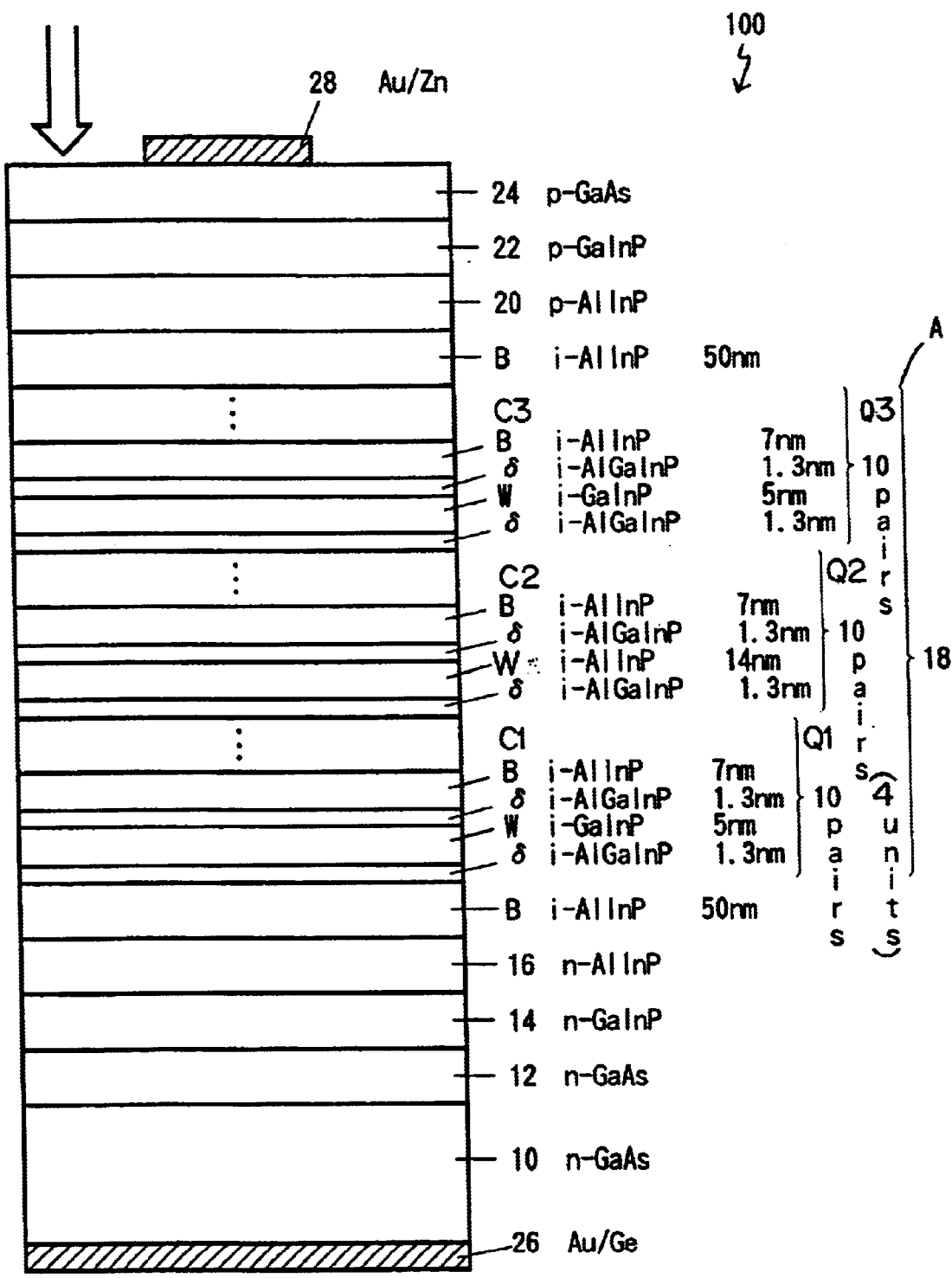
FIG. 6 is a sectional view showing a first exemplary structure of a semiconductor device 100.

FIG. 6 is a sectional view of a semiconductor device 100 having an pin junction structure in which a quantum-wave interference layer is formed in an i-layer. The light-receiving device 100 has a substrate 10 made of gallium arsenide (GaAs). A GaAs buffer layer 12 of n-type conduction, having a thickness generally of 0.3 μm and an electron concentration of $2\times10^{18}/cm^3$, is formed on the substrate 10. An n-$Ga_{0.51}In_{0.49}P$ contact layer 14 of n-type conduction, having a thickness generally of 0.13 μm and electron concentration of $2\times10^{18}/cm^3$, is formed on the buffer layer 12. An n-$Al_{0.51}In_{0.49}P$ n-layer 16 of n-type conduction, having a thickness generally of 0.2 μm and an electron concentration of $1\times10^{18}/cm^3$, is formed on the contact layer 14. A non-doped i-layer 18 is formed on the n-layer 16. An $Al_{0.51}In_{0.49}P$ p-layer 20 of p-type conduction, having a thickness generally of 0.2 μm and a hole concentration of $1\times10^{18}/cm^3$, is formed on the i-layer 18. A p-$Ga_{0.51}In_{0.49}P$ second contact layer 22 of p-type conduction, having a thickness generally of 0.13 μm and a hole concentration of $2\times10^{18}/cm^3$, is formed on the p-layer 20. A p-GaAs first contact layer 24 of p-type conduction, having a thickness generally of 0.06 μm and a hole concentration of $2\times10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of Au/Zn, having a thickness generally of 0.2 μm, is formed on some portion of the first contact layer 24.

A quantum-wave interference unit $Q_1$ having a multi-quantum layer structure with 10 pairs of a $Ga_{0.51}In_{0.49}P$ first layer W, having a thickness of 5 nm, a $Al_{0.51}In_{0.49}P$ second layer B, having a thickness of 7 nm, and a non-doped $Al_{0.33}Ga_{0.33}In_{0.33}P$ δ layer, having a thickness of 1.3 nm, sandwiching the first layer W is formed in the i-layer 18. $Q_2$, ... $Q_4$ are formed like $Q_1$ and 4 quantum-wave interference units in total are formed in the i-layer 18. FIG. 5 shows a band structure of the quantum-wave interference layer $Q_1$ in detail. Non-doped $Ga_{0.51}In_{0.49}P$ carrier accumulation layers $C_1$ to $C_3$, having a thickness of 20 nm, are formed between any quantum-wave interference units $Q_i$ and $Q_{i+1}$, respectively. Thicknesses of the first layer W and the second layer are determined according to Eqs. 1 and 2, respectively, on condition that a forward voltage is applied to the interface between the electrodes 28 and 26, and that no electric potential gradient is occurring in the i-layer 18.

The second layers B which contact to the n-layer 16 and the p-layer 20 have a thickness of 0.05 μm, respectively.

They are formed thicker than other second layers to prevent a tunneling conduction of carriers from the n-layer 16 or the p-layer 20 to the first layer W. And the substrate 10 has a diameter of 2.0 inches and the normal direction of its main surface is offset toward the [011] axis by 15 degree from the (100) plane.

The light-receiving device 100 was manufactured by gas source molecular beam epitaxial deposition (GS-MBE) which is an epitaxial growth method under an extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorous (P) are supplied by heat decomposition of gas material such as $AsH_3$ and $PH_3$. Alternatively, the light-receiving device 100 can be manufactured by metal organic chemical vapor deposition (MOCVD).

Figure 1:
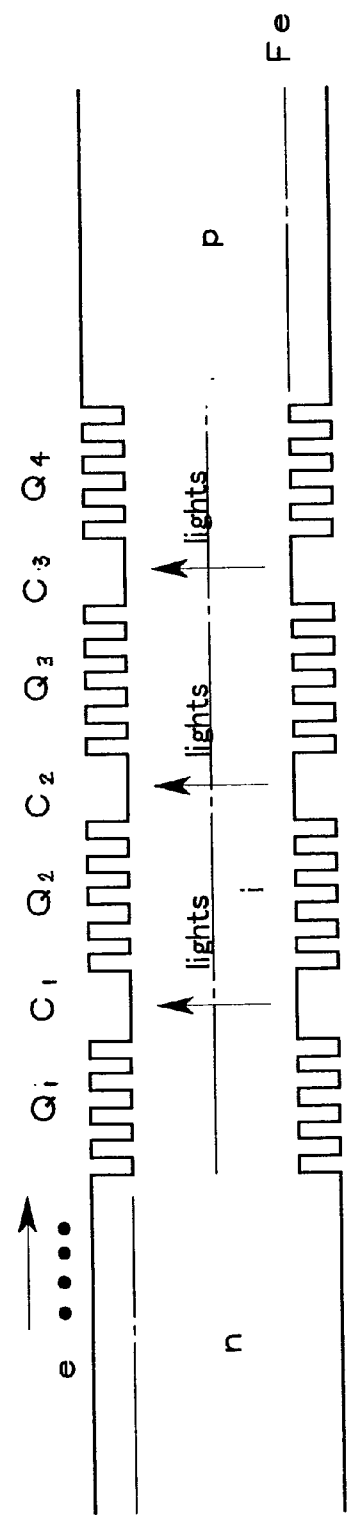
FIG. 1 is a view showing the energy diagram of a quantum-wave interference layer according to the present invention.
Figure 2:
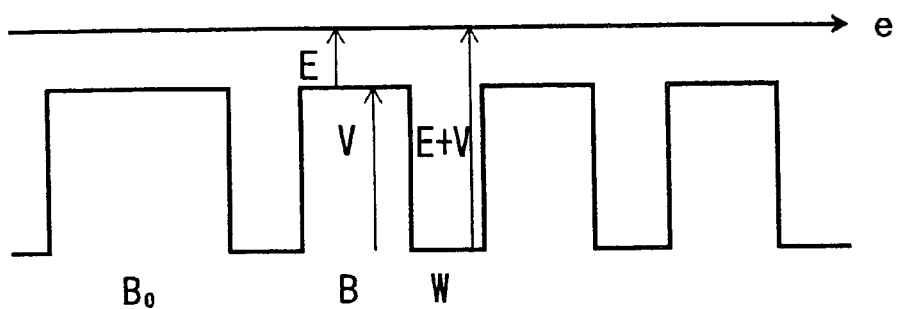
FIG. 2 is an explanatory view of a conduction band of a multi-layer structure of the present invention.
Figure 3:
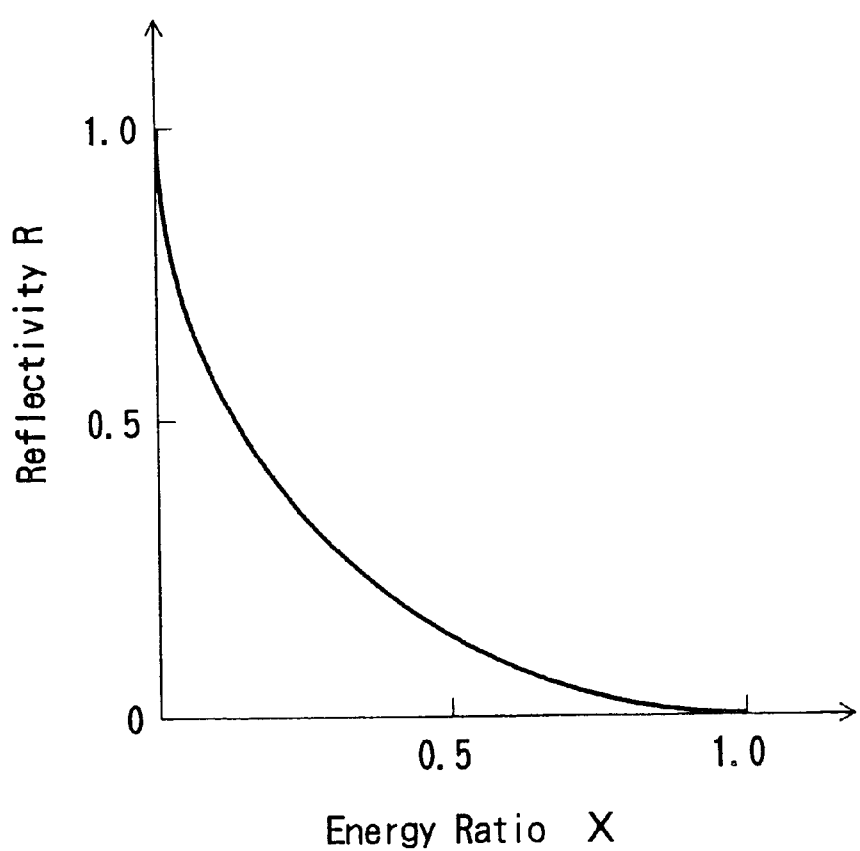
FIG. 3 is a graph showing a relation between an energy ratio x and a reflectivity R.
Figure 4:
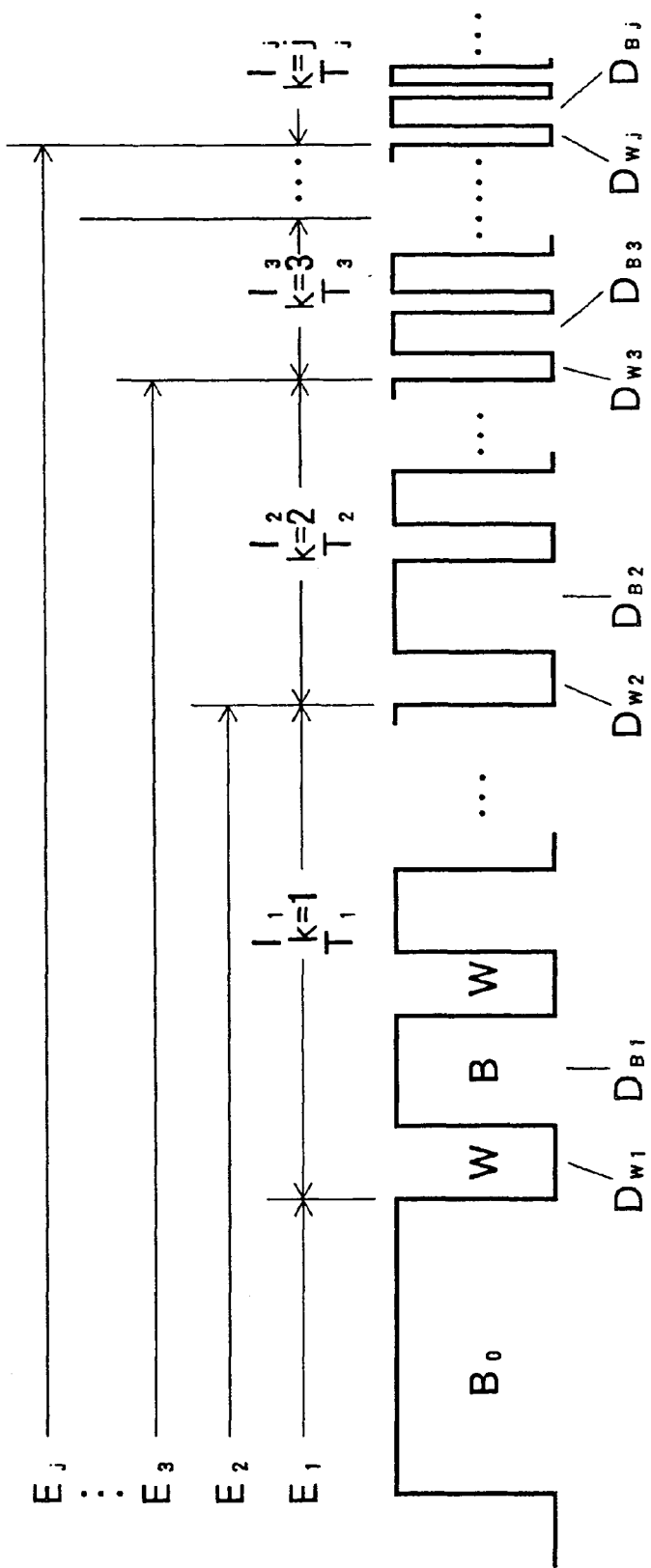
FIG. 4 is an explanatory view of partial quantum-wave interference layers $I_k$.

As shown in FIG. 1, as a forward voltage V applied to the interface between the p-layer 20 and the n-layer 16 of the light-receiving device 100 increases, an electric potential gradient occurring in the i-layer 18 becomes gentler until it becomes planar. In this condition, electrons do not flow because a reflection condition to electrons in quantum-wave interference layers $Q_1$ to $Q_4$ is satisfied.

When light having an energy resonant to the bandwidth of carrier accumulation layers $C_1$ to $C_3$ is incident, electrons are excited in the carrier accumulation layers $C_1$ to $C_3$. An electron concentration in the carrier accumulation layers $C_1$ to $C_3$ becomes larger, and many electrons come to exist at levels higher than the bottom of a conduction band in the second layer B. Then electrons in the n-layer 16 are conducted into the carrier accumulation layers $C_1$ which is adjacent to the n-layer 16, and electrons in the carrier accumulation layers $C_1$ are conducted into the carrier accumulation layers $C_2$. Accordingly, electrons intervene each carrier accumulation layers $C_1$ and are conducted to each carrier accumulation layers at a high speed, by wave propagation of electrons as a wave. Thus electrons are conducted from the n-layer 16 to the p-layer 20 by a light excitation at a high speed.

The light-receiving device 100 has a high opto-electric conversion effectivity because electrons, which are excited in the carrier accumulation layers $C_1$ to $C_3$, function as a gate-controlled switch toward the conduction of electrons from the n-layer 16 to the p-layer 20. When electrons are not excited in the carrier accumulation layers $C_1$ to $C_3$, a condition to reflect electrons is satisfied in the quantum-wave interference layers $Q_1$ to $Q_4$. But when electrons are excited in the carrier accumulation layers $C_1$ to $C_3$, the condition is not satisfied and electrons may be conducted in the quantum-wave interference layers $Q_1$ to $Q_4$ as a wave. Accordingly, a switching velocity is considered to be larger.

Figure 7:
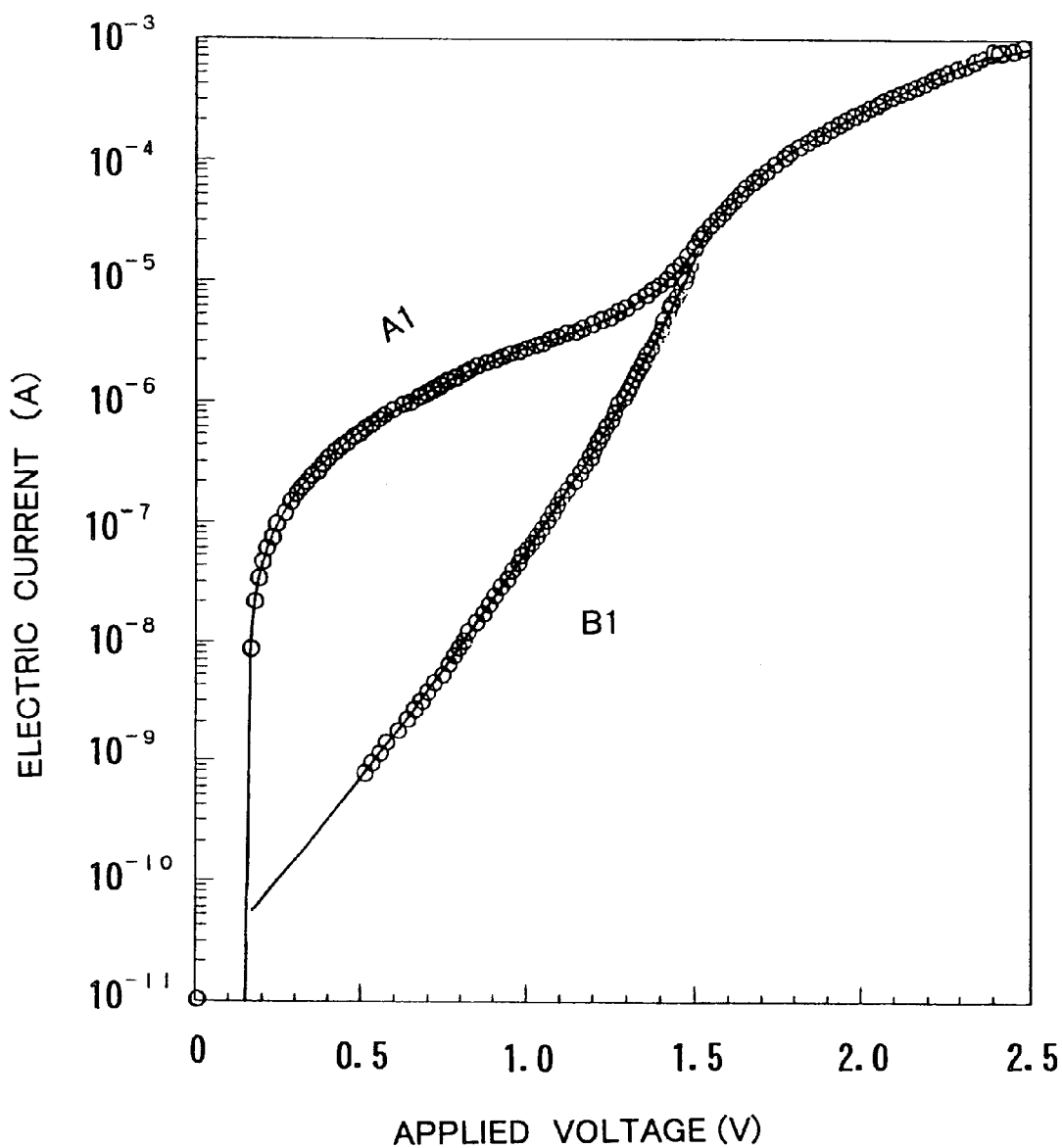
FIG. 7 is a graph showing V-I characteristics of the light-receiving device 100 when light is incident and not incident.

Measured V-I characteristics of the light-receiving device 100 are shown in FIG. 7. When light is incident, the photocurrent rises abruptly from $10^{-11}$ to $10^{-7}$, or in the range of 4 orders, at the forward voltage of 0.2 V. But even if a forward voltage is applied to the device, a dark current is suppressed at a lower value and degree of increasing is also suppressed. The phenomenon occurs because the dark electrons reflected by the quantum-well interference layers and the dark current is kept comparatively lower. And the photocurrent when light is incident on the diode, represented by A1, is about one hundredfold of a dark current, represented by B1. Additionally, the forward applied voltage at which an electric potential gradient in the i-layer 18 becomes planar appears to be 1 V. When an applied forward voltage is 1 V, the photocurrent is not less than $5\times10^{-6}$ A.

Figure 8:
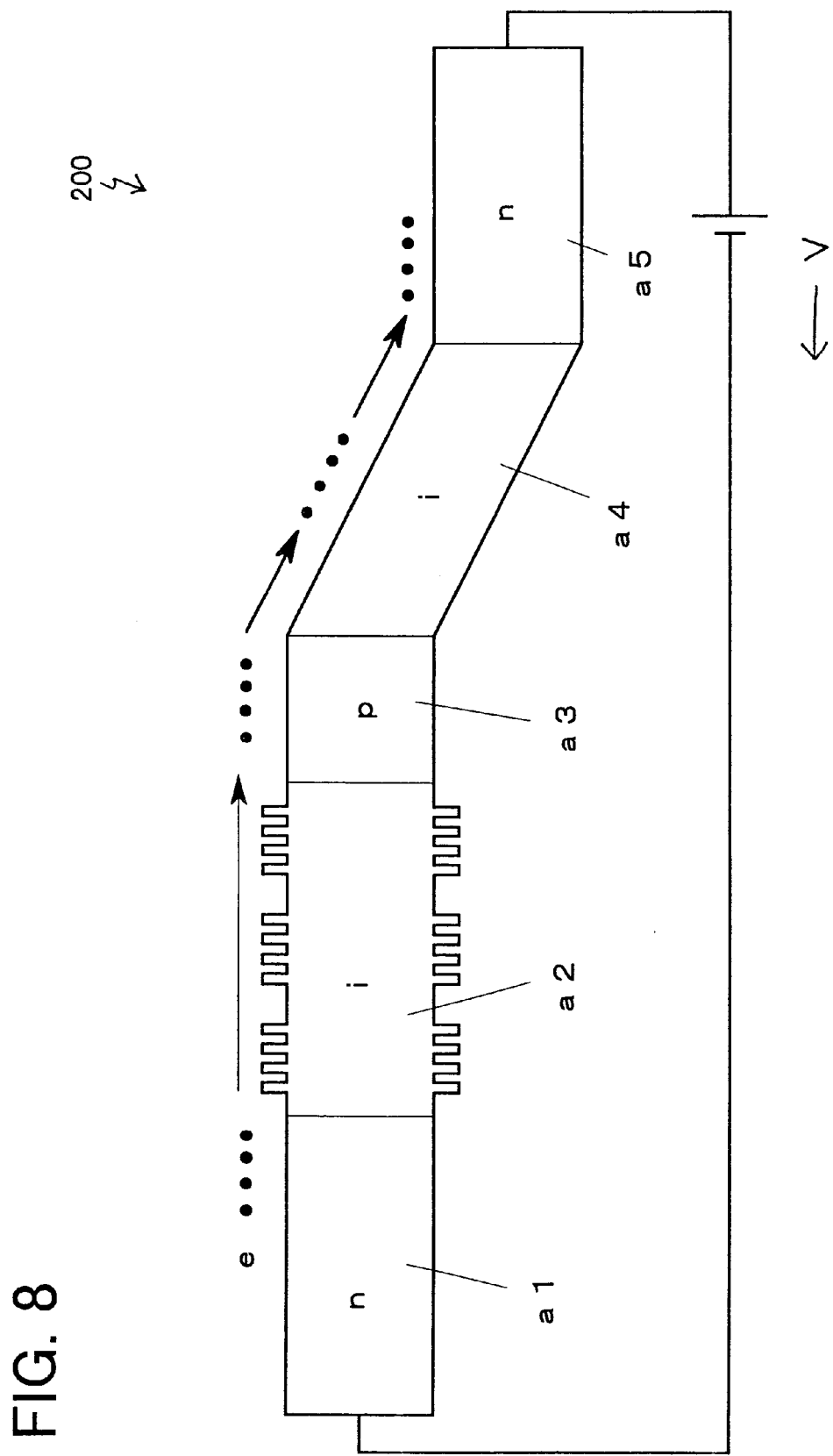
FIG. 8 is an explanatory view showing a structure of a light-receiving device 200.
Figure 9:
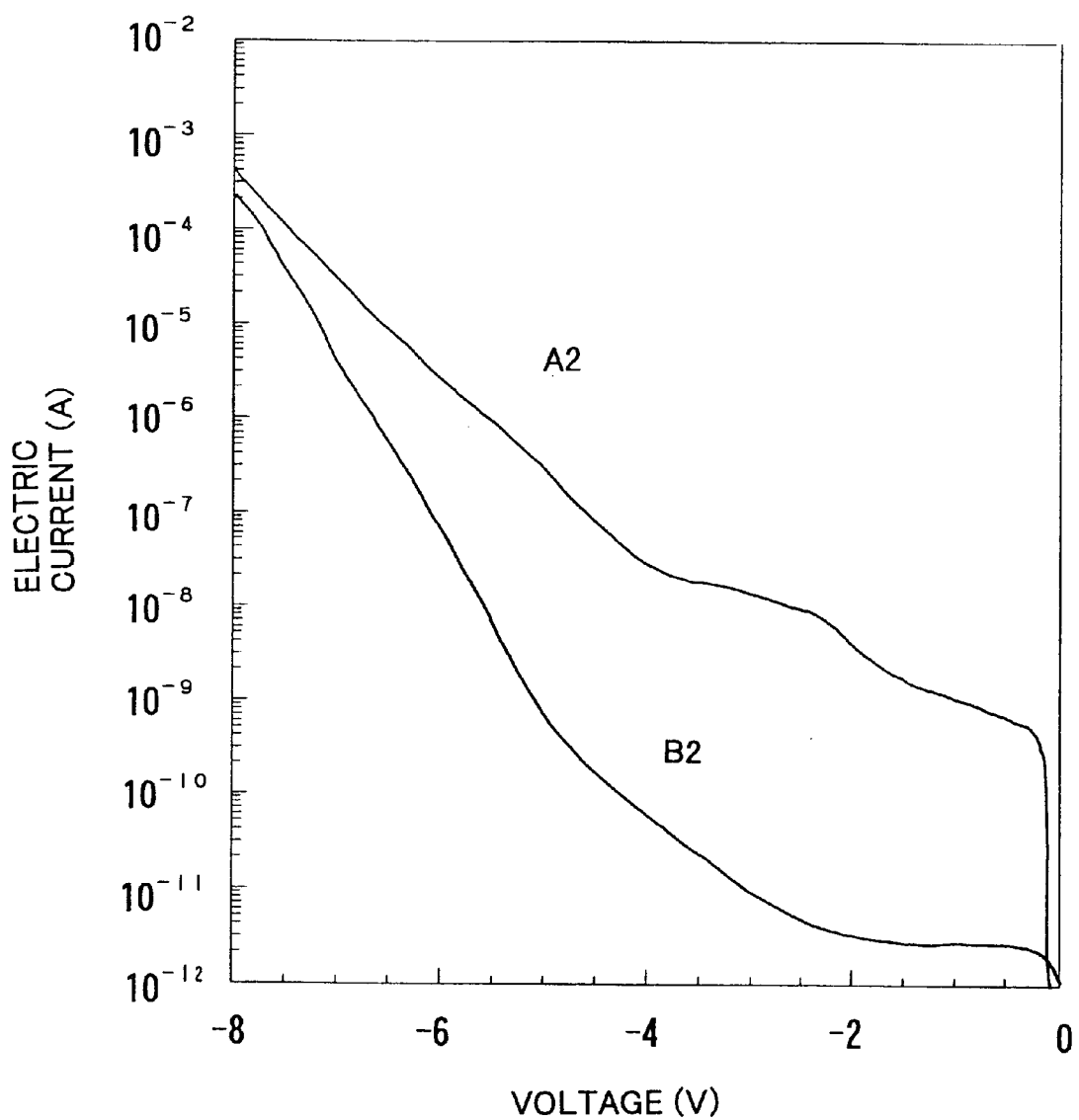
FIG. 9 is a graph showing V-I characteristic of the light-receiving device 200 when light is incident and not incident.

A light-receiving device 200 having an nipin structure shown in FIG. 8 is formed. The regions represented by a1, a2, and a3 are the same as those in the light-receiving device 100 having an nip structure. A quantum-wave interference layer and a carrier accumulation layer are formed in an i-layer a2. Regions a4 and a5 function to draw the photocurrent which flows into the p-type region a3 by a reverse external bias voltage. The V-I characteristic was measured when the light-receiving device 200 is incident by light. As shown in FIG. 9, the photocurrent, represented by A2, is about one thousandfold that of a dark current, represented by B2.

Figure 10:
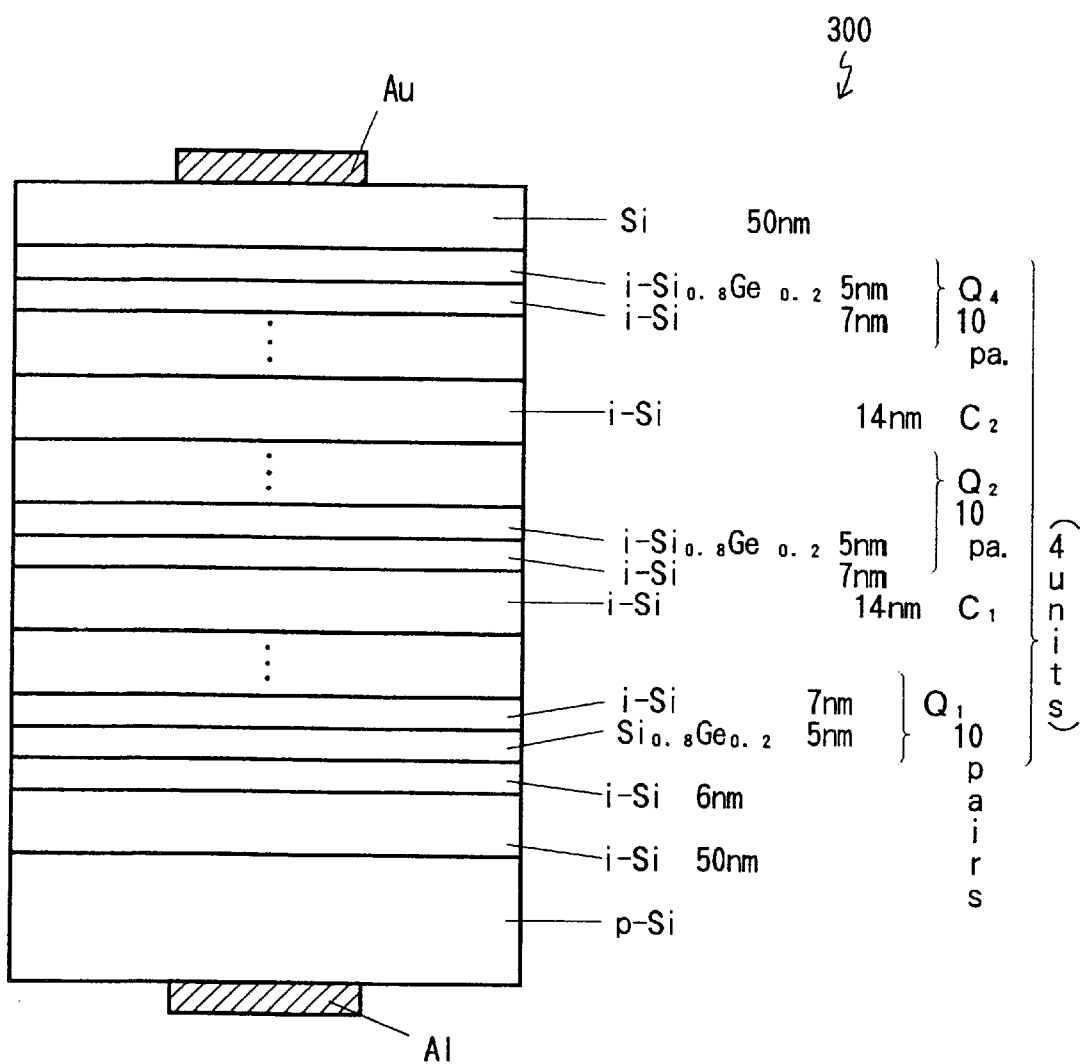
FIG. 10 is an explanatory view showing a structure of a light-receiving device 300.

A light-receiving device 300 using Si/Ge compound semiconductor shown in FIG. 10 is formed. A first layer W made of $Si_{0.8}Ge_{0.2}$ and a second layer B made of Si are formed to have thicknesses of 5 nm and 7 nm, respectively. Carrier accumulation layers $C_1$ to $C_3$ made of $Si_{0.8}Ge_{0.2}$ are formed to have a thickness of 20 nm. No $\delta$ layer is formed in the device 300.

Figure 11:
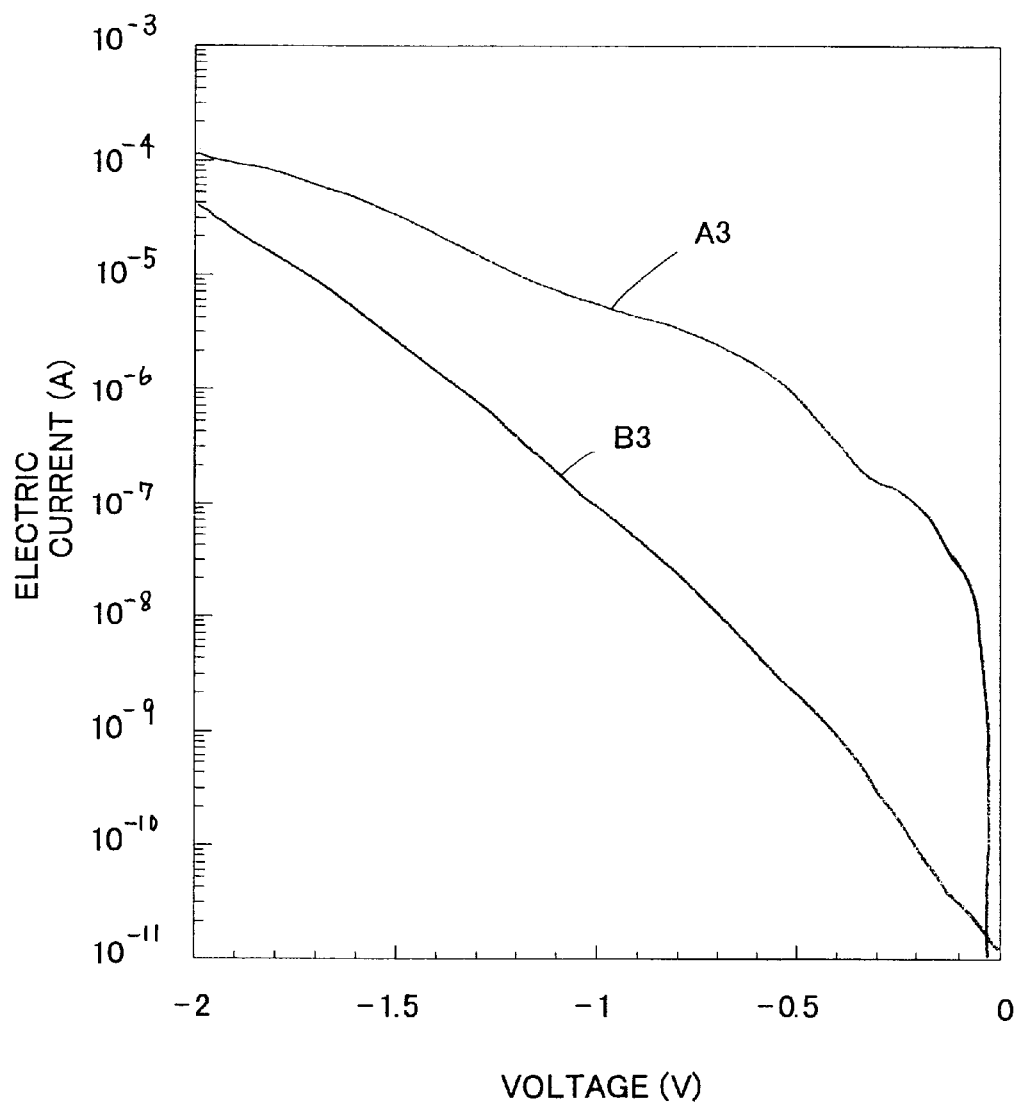
FIG. 11 is a graph showing V-I characteristic of the light-receiving device 300 when light is incident and not incident.

A characteristic of the device 300 was measured when the device is incident by light. As shown in FIG. 11, the photocurrent, represented by A3, is one thousandfold that of a dark current, represented by B3. When the estimated forward voltage between n-layer a1 and p-layer a3 is about 0.9 V, the photocurrent rises abruptly. Further, by forming a $\delta$ layer, the characteristic of the light-emitting device 300 will be improved.

Accordingly, the light-receiving device of the present invention can obtain a larger S/N ratio compared with conventional devices.

In the embodiment, a $\delta$ layer is formed in the devices 100 and 200. The $\delta$ layer improves the reflectivity of the devices 100 and 200. Alternatively, because the reflectivity can be improved by a multipath reflection, the $\delta$ layer is not necessarily needed.

In the embodiment, four quantum-wave interference units $Q_1$ to $Q_4$ are connected in series, with a carrier accumulation layer C lying between each of the quantum-wave interference units. Alternatively, an arbitrary number of the quantum-wave interference units can be connected in series.

In the first and second embodiments, the quantum-wave interference layer was formed to have a multi-layer structure including $Ga_{0.51}In_{0.49}P$ and $Al_{0.51}In_{0.49}P$. Alternatively, quantum-wave interference layer can be made of quaternary compounds such as a general formula $Al_xGa_yIn_{1-x-y}P$, selecting an arbitrary composition ratio within the range of $0 \leq x \leq 1$, $0 \leq y \leq 1$, and $0 \leq x+y \leq 1$. Further alternatively, the quantum-wave interference unit can be made of a pair of group III-V compound semiconductors with different composition ratios, a pair of group II-VI compound semiconductors with different composition ratios, a pair of Si and Ge, and semiconductors of other hetero-material.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A light-receiving device which converts an incident light into an electric current, comprising:

quantum-wave interference layer units having plural periods of a pair of a first layer and a second layer, said second layer having a wider band gap than said first layer; and a carrier accumulation layer disposed between adjacent two of said quantum-wave interference layer units;

wherein the thickness of said first layer is equal to an odd multiple of one fourth of the quantum-wave wavelength of carriers in the first layer, the thickness of said second layer is equal to an odd multiple of one fourth of the quantum-wave wavelength of carriers in the second layer;

the carriers in said first and second layers are selected from the group consisting of electrons and holes;

wherein said quantum-wave interference layer units comprise a plurality of partial quantum-wave interference layers $I_k$ with $T_k$ periods of said pair of said first layer and said second layer being displaced in series by varying k as 1, 2, . . . , wherein index k of said plurality of said partial quantum-wave interference layers correspond to index k of kinetic energy level $E_k$ and said first and second layers have thicknesses of $n_{Wk}\lambda_{Wk}/4$, and $n_{Bk}\lambda_{Bk}/4$, respectively, where $E_k+V$ and $E_k$, $\lambda_{Wk}$ and $\lambda_{Bk}$, and $n_{Wk}$, $n_{Bk}$ represent a kinetic energy level of carriers flowing into respective said first layer and said second layer, wavelength of quantum-wave of carriers flowing into respective said first layer and said second layer, and odd numbers, respectively;

wherein said quantum-wave wavelength $\lambda_{Wk}$ in said first layer is determined by a formula $\lambda_{Wk}=h/[2m_w(E_k+V)]^{1/2}$, said quantum-wave wavelength $\lambda_{Bk}$ in said second layer is determined by a formula $\lambda_{Bk}=h/(2m_BE_k)^{1/2}$, where h, $m_W$, $m_B$, represent Plank's constant, an effective mass of said carrier in said first layer, and an effective mass of said carrier in said second layer, respectively, and wherein $E_k \leq V/9$ for each k.

2. A light-receiving device according to claim 1, where in said carrier accumulation layer has the same band gap as that of said first layer.

3. A light-receiving device according to claim 2, wherein said carrier accumulation layer has a thickness equal to said quantum-wave wavelength $\lambda_{Wk}$ in one of said two adjacent quantum-wave interference layer units.

4. A light-receiving device according to claim 1, wherein said carrier accumulation layer has a thickness equal to said quantum-wave wavelength $\lambda_{Wk}$ in one of said two adjacent quantum-wave interference layer units.

5. A light-receiving device according to claim 4, further comprising a δ layer between said first layer and said second layer, said δ layer being thinner than said first layer and said second layer, and having an energy band gap that is different from said first and second layers.

6. A light-receiving device according to claim 4 further comprising:

a pin junction structure; and wherein said carrier accumulation layer is formed in said i-layer.

7. A light-receiving device according to claim 4, wherein said quantum-wave interference layer or said carrier accumulation layer is formed in an n-layer or a p-layer.

8. A light-receiving device according to claim 4, further comprising a pn junction structure.

9. A light-receiving device according to claim 1, further comprising a δ layer between said first layer and said second layer, said δ layer being thinner than said first layer and said second layer, and having an energy band gap that is different from said first and second layers.

10. A light-receiving device according to claim 1 further comprising:

a pin junction structure; and wherein said carrier accumulation layer is formed in said i-layer.

11. A light-receiving device according to claim 1, wherein said quantum-wave interference layer or said carrier accumulation layer is formed in an n-layer or a p-layer.

12. A light-receiving device according to claim 1, further comprising a pn junction structure.

13. A light-receiving device which converts an incident light into an electric current, comprising:

quantum-wave interference layer units having plural periods of a pair of a first layer and a second layer, said second layer having a wider band gap than said first layer; and a carrier accumulation layer disposed between adjacent two of said quantum-wave interference layer units;

wherein the thickness of said first layer is equal to an odd multiple of one fourth of the quantum-wave wavelength of carriers in the first layer, the thickness of said second layer is equal to an odd multiple of one fourth of the quantum-wave wavelength of carriers in the second layer;

the carriers in said first and second layers are selected from the group consisting of electrons and holes;

wherein a kinetic energy ($E_k$) of said carriers in said second layer is set near the bottom of a conduction band of said second layer when carriers are electrons and is set near the bottom of a valence band of said second layer when the carriers are holes;

wherein said quantum-wave interference layer units comprise a plurality of partial quantum-wave interference layers $I_k$ with $T_k$ periods of said pair of said first layer and said second layer being displaced in series by varying k as 1, 2, . . . , wherein index k of said plurality of said partial quantum-wave interference layers correspond to index k of said kinetic energy level $E_k$ and said first and second layers have thicknesses of $n_{Wk}\lambda_{Wk}/4$, and $n_{Bk}\lambda_{Bk}/4$, respectively, where $E_k+V$, $\lambda_{Wk}$ and $\lambda_{Bk}$, and $n_{Wk}$, $n_{Bk}$ represent a kinetic energy level of carriers flowing into said first layer, a wavelength of quantum-wave of carriers flowing into respective said first layer and said second layer, and odd numbers, respectively;

wherein said quantum-wave wavelength $\lambda_{Wk}$ in said first layer is determined by a formula $\lambda_{Wk}=h/[2m_W(E_k+V)]^{1/2}$, said quantum-wave wavelength $\lambda_B$ in said second layer is determined by a formula $\lambda_{Bk}=h/(2m_BE_k)^{1/2}$, where h, $m_W$, $m_B$, represent Plank's constant, an effective mass of said carrier in said first layer, and an effective mass of said carrier in said second layer, and wherein $E_k \leq V/9$ for each k.

14. A light-receiving device according to claim 13, wherein said carrier accumulation layer has the same band gap as that of said first layer.

15. A light-receiving device according to claim 14, further comprising a δ layer between said first layer and said second layer, said δ layer being thinner than said first layer and said second layer, and having an energy band gap that is different from said first and second layers.

16. A light-receiving device according to claim 14 further comprising:

a pin junction structure; and wherein said carrier accumulation layer is formed in said i-layer.

17. A light-receiving device according to claim 14, wherein said quantum-wave interference layer or said carrier accumulation layer is formed in an n-layer or a p-layer.

18. A light-receiving device according to claim 14, further comprising a pn junction structure.

19. A light-receiving device according to claim 13, wherein said carrier accumulation layer has a thickness equal to said quantum-wave wavelength $\lambda_{Wk}$ in one of said two adjacent quantum-wave interference layer units.

20. A light-receiving device according to claim 13, further comprising a δ layer between said first layer and said second layer, said δ layer being thinner than said first layer and said second layer, and having an energy band gap that is different from said first and second layers.

21. A light-receiving device according to claim 13 further comprising:

a pin junction structure; and wherein said carrier accumulation layer is formed in said i-layer.

22. A light-receiving device according to claim 13, wherein said quantum-wave interference layer or said carrier accumulation layer is formed in an n-layer or a p-layer.

23. A light-receiving device according to claim 13, further comprising a pn junction structure.

* * * * *